United States Patent
Yoon et al.

(10) Patent No.: US 6,358,829 B2
(45) Date of Patent: *Mar. 19, 2002

(54) SEMICONDUCTOR DEVICE FABRICATION METHOD USING AN INTERFACE CONTROL LAYER TO IMPROVE A METAL INTERCONNECTION LAYER

(75) Inventors: Mee-Young Yoon; Sang-In Lee; Hyun-Seok Lim, all of Kyungki-do (KR)

(73) Assignee: Samsung Electronics Company., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/397,616

(22) Filed: Sep. 16, 1999

(30) Foreign Application Priority Data

Sep. 17, 1998 (KR) .............................. 98-38413

(51) Int. Cl.⁷ ................................................ H01L 21/44
(52) U.S. Cl. ...................... 438/597; 438/643; 438/687; 438/680
(58) Field of Search ................................ 438/642, 643, 438/644, 687, 688, 597, 680

(56) References Cited

U.S. PATENT DOCUMENTS 5,391,517 A * 2/1995 Gelatos et al.
5,552,341 A * 9/1996 Lee

\* cited by examiner

Primary Examiner—Tuan H. Nguyen
(74) Attorney, Agent, or Firm—Skjerven, Morrill, MacPherson; David W. Heid

(57) ABSTRACT

A method for fabricating a semiconductor device having an aluminum (Al) interconnection layer with excellent surface morphology forms an interface control layer having a plurality of atomic layers before forming the Al interconnection layer. In the fabrication method, an interlayer dielectric (ILD) film having a contact hole which exposes a conductive region of the semiconductor substrate is formed on a semiconductor substrate, and an interface control layer having a plurality of atomic layers continuously deposited is formed on the inner wall of the contact hole and the upper surface of the interlayer dielectric film, to a thickness on the order of several angstroms to several tens of angstroms. Then, chemical vapor deposition (CVD) completes an Al blanket deposition on the resultant structure, including the interface control layer, to form a contact plug in the contact hole and an interconnection layer on the interlayer dielectric film.

25 Claims, 6 Drawing Sheets

SEMICONDUCTOR DEVICE FABRICATION METHOD USING AN INTERFACE CONTROL LAYER TO IMPROVE A METAL INTERCONNECTION LAYER

BACKGROUND OF THE INVENTION

1. Field of the Invention

The present invention relates to a method for fabricating a semiconductor device, and more particularly, to a method for fabricating a semiconductor device having a metal interconnection layer connected to a lower conductive layer via a fine contact.

2. Description of the Related Art

Higher levels of integration in semiconductor devices have lead to contact holes having smaller diameters and higher aspect ratios. Accordingly, technologies that can effectively fill such fine contact holes have been suggested. A conventional physical vapor deposition (PVD) produces a layer having poor step coverage and thus does not completely fill a fine contact hole. As an alternative, chemical vapor deposition (CVD) can fill a contact hole with tungsten (W), forming a tungsten plug. However, tungsten plugs have high resistivity and increase contact resistance. Contact resistance increases further when a tungsten plug reacts with an aluminum (Al) interconnection layer formed thereon. Blanket deposition of aluminum provides a relatively low resistivity material that does not react with aluminum interconnect layers. However, as the thickness of a CVD deposited Al layer increases, the surface morphology of the Al layer becomes more irregular which makes filling of contact holes difficult.

SUMMARY OF THE INVENTION

In accordance with an aspect of the present invention, a fabrication process forms an interface control layer before a blanket deposit of a conductive layer of aluminum or a similar material. The interface control layer is a thin layer typically including multiple atomic layers. The interface control layer provides uniformly and densely distributed nucleation sites from which the conductive layer grows uniformly. Accordingly, the fabrication process forms a smooth-surfaced aluminum layer that can fill fine contact holes.

In accordance with one embodiment of the present invention, a semiconductor device includes an interlayer dielectric (ILD) film having a contact hole on a semiconductor substrate. The contact hole exposes a conductive region of the semiconductor substrate. The fabrication method forms an interface control layer having multiple atomic layers deposited on an inner wall of the contact hole and an upper surface of the interlayer dielectric film and then deposits Al on the interface control layer by a chemical vapor deposition (CVD) to form both a contact plug in the contact hole and an interconnection layer connected to the contact plug. Between forming the interface control layer but after forming the ILD film, an ohmic layer can be formed on the exposed conductive region of the semiconductor substrate, the side wall of the contact hole in the interlayer dielectric film, and the upper surface of the interlayer dielectric film; and a barrier layer such as a Ti-rich TiN layer can be formed on the ohmic layer.

An atomic layer deposition (ALD), cyclic CVD or digital CVD can form the interface control layer by depositing a single metal or an alloy film. For example, the interface control layer can be a thin aluminum (Al) film containing silicon (Si). To form such interface control layer, a flow of Si-containing gas is applied a structure including the barrier layer, to adsorb Si to the surface of the barrier layer, and then excess Si-containing gas is removed from around the structure. Applying an Al-containing gas to the resultant structure adsorbs Al to the surface of the barrier layer and to the adsorbed Si. Then, excess Al-containing gas is removed from around the structure, and these steps are repeated to form on the barrier layer a thin Al film containing Si. During the Al adsorption, hydrogen ($H_2$) gas may be supplied together with the Al-containing gas to facilitate deposition of Al.

Forming the contact plug and the interconnection layer can be performed in-situ, in the same processing device or chamber in which the interface control layer is formed.

The fabrication method can further include adsorbing hydrogen or nitrogen to the surface of the interface control layer to form a surface treatment layer on the interface control layer, before forming the contact plug and the interconnection layer. The surface treatment layer prevents oxidation of the interface control layer and maintains the desired density and uniformity of nucleation sites.

In addition to the above steps, fabrication methods in accordance with other embodiments of the invention can include annealing after depositing the Al interconnection layer on the interface control layer. The annealing forms an interconnection layer doped by a diffusion of atoms from the interface control layer into the interconnection layer. In the method, the interface control layer is typically copper (Cu), titanium (Ti), tungsten (W), silicon (Si), tantalum (Ta) or silver (Ag).

When the interface control layer contains copper, a source gas such as (hexafluoroacetyl)copper(trimethylvinylsilane) [(hfac)Cu(TMVS)], $CuCl_2$, $Cu_2I_4$, or a combination thereof is applied to adsorb Cu to the surface of the barrier layer. To form multiple atomic layers, the chamber containing the resultant structure is purged using a purging gas, and then applying the copper containing gas and purging are repeated. Annealing for diffusion of copper is typically performed at 300 to 650° C.

When the interface control layer is formed of Ti, a gas such as $TiCl_4$, tridiethylamine titanate (TDEAT), tridimethylamine titanate (TDMAT), or a combination thereof is flushed across the surface to adsorb Ti.

When the interface control layer is formed of W, the flushing is performed with $WF_6$ gas.

When the interface control layer is formed of Si, a gas such as $SiH_4$, $SiH_3Cl$, $SiHCl_3$, $Si_2H_6$, $SiCl_4$ or a combination thereof is flushed. Here, annealing may be performed at 400 to 650° C.

Another method for fabricating a semiconductor device includes forming an interlayer dielectric (ILD) film having a contact hole that exposes a conductive region of a semiconductor substrate. A first interface control layer as a thin Al film containing Si is formed on the inner wall of the contact hole and the upper surface of the interlayer dielectric film, to a thickness on the order of several angstroms to several tens of angstroms. Then, a second interface control layer having a plurality of atomic layers of a material such as Cu is formed on the first interface control layer, and an Al blanket deposition is performed on the resultant structure by chemical vapor deposition (CVD), to form a conductive layer filling the contact hole and simultaneously covering the upper surface of the interlayer dielectric film. Annealing the resultant structure forms an Al interconnection layer doped with Si and Cu.

Between forming the first interface control layer and forming the ILD film, an ohmic layer can be formed on the exposed conductive region of the substrate, the side wall of the interlayer dielectric film in the contact hole, and the upper surface of the interlayer dielectric film, and then a barrier layer is formed on the ohmic layer. The first interface control layer is formed on the barrier layer.

Atomic layer deposition (ALD), cyclic CVD or digital CVD can form the first and second interface control layers, and the first interface control layer, the second interface control layer and the conductive layer can be formed successively formed in-situ in the same deposition chamber. In one embodiment, between forming the conductive layer and forming the second interface control layer, a surface treatment layer on the second interface control layer is formed to prevent oxidation of the surface of the second interface control layer.

According to an aspect of the present invention, a semiconductor device fabrication method forms an Al interconnection layer having excellent surface morphology and thereby improves reliability of the interconnection layer.

BRIEF DESCRIPTION OF THE DRAWINGS

The features and advantages of the present invention will become more apparent by describing in detail specific embodiments thereof with reference to the attached drawings in which.

DESCRIPTION OF THE PREFERRED EMBODIMENTS

Figure 1A:
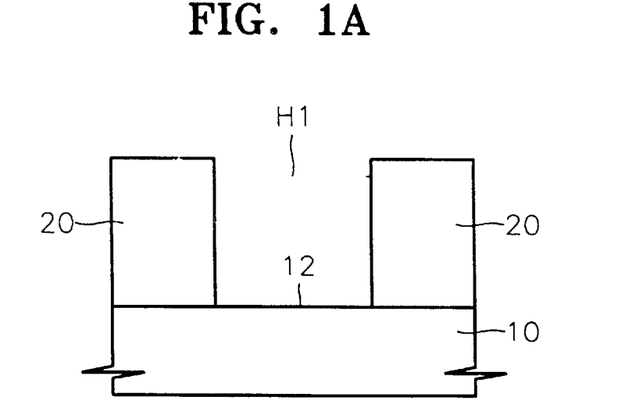
FIGS. 1A through 1E are sectional views of semiconductor structures illustrating a semiconductor device fabrication method according to an embodiment of the present invention.

FIGS. 1A to 1E illustrate structures formed during a semiconductor device fabrication method according to an embodiment of the present invention. FIG. 1A shows an interlayer dielectric (ILD) film 20 on a semiconductor substrate 10. ILD film 20 includes a contact hole Hi that exposes conductive region 12 of semiconductor substrate. ILD film 20 can be any type of dielectric of insulating layer that separates conductive layers in a semiconductor device. In an exemplary embodiment, ILD film 20 is an oxide layer, and known oxide deposition and patterning of the deposited oxide layer form ILD film 20.

Figure 1B:
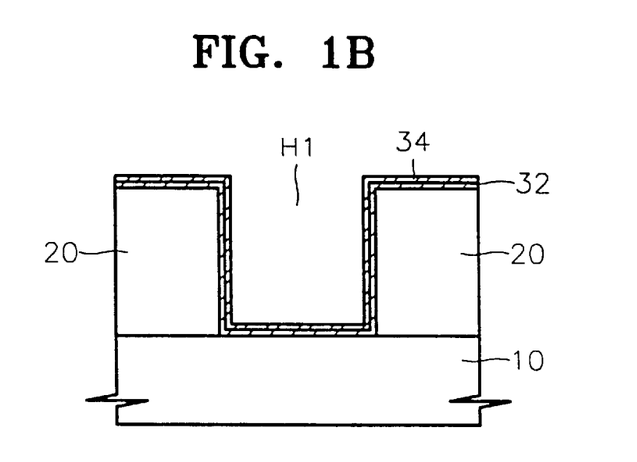

Referring to FIG. 1B, conventional chemical or physical vapor deposition processes form an ohmic layer 32, e.g., Ti layer, on inner walls of contact hole H1 and on a top surface of ILD film 20, and a barrier layer 34 on ohmic layer 32. In the exemplary embodiment, barrier layer 34 is a Ti-rich TiN layer containing a higher Ti content than a regular TiN layer. A conventional CVD or PVD process can form the Ti-rich TiN barrier layer. In the conventional CVD process, the ration of $NH_3$ to $TiCl_4$ can be decreased in order to increase the amount of $TiCl_4$ used and increase the amount of Ti in the deposited layer. In the PVD process, the reactive gas ratio of $N_2$ to Ar can be decreased to increase the amount of Ar relative to the amount of $N_2$.

Figure 1C:
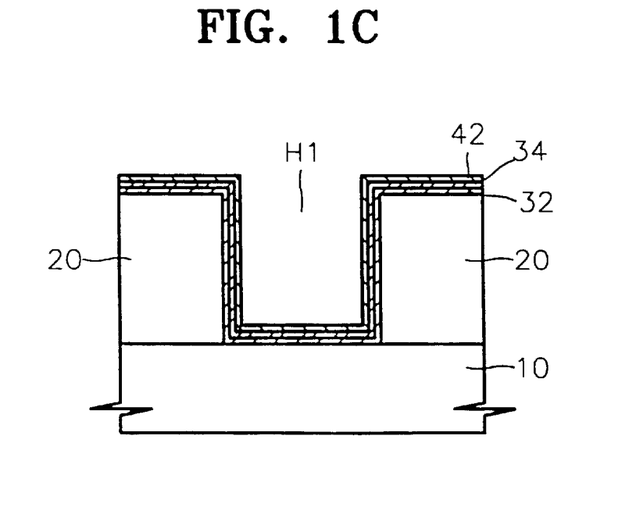

Referring to FIG. 1C, an atomic layer deposition (ALD), a cyclic chemical vapor deposition, or a digital chemical vapor deposition forms an interface control layer 42. Atomic layer deposition, cyclic chemical vapor deposition, or digital chemical vapor deposition are processes well know in the art and can be performed in the conventional manner to form thin layers. In the exemplary embodiment, interface control layer 42 is an aluminum (Al) film containing silicon (Si) and includes multiple atomic layers. Interface control layer 42 is on the inner wall of contact hole H1 and the upper surface of ILD film 20 which have been covered with ohmic layer 32 and barrier layer 34. Interface control layer 42 has a thickness of several angstroms to several tens of angstroms, e.g., 3 to 50 Å, and preferably, less than 10 Å.

An advantage of ALD in forming interface control layer 42 is that ALD can form highly densified thin layers by supplying required source gases in sequence. Thus, when CVD forms an Al layer several thousands of angstroms thick on interface control layer 42, the Al layer can have a smooth flat surface morphology and completely fill contact hole H1, which has a large step difference and a high aspect ratio.

In the exemplary embodiment, ALD that forms interface control layer 42 supplies a flow of Si-containing gas, such as silane ($SiH_4$), at about 100 sccm (standard cubic centimeter per minute) for about 30 seconds or less in a carrier gas such as $H_2$, Ar, or He at about 100 sccm, and the semiconductor structure including barrier layer 34 is in an ALD chamber at 300 to 800° C., preferably about 320 to 420° C. and a pressure of about 0.1 to 5 torr, preferably 0.5 to 1.5 torr. Under these conditions, $SiH_4$ decomposes so that Si atoms are adsorbed to barrier layer 34. $SiH_3Cl$, $SiH_2Cl_2$, $SiHCl_3$, $Si_2H_6$ or $SiCl_4$ also can be used as the Si-containing gas. Excess Ti in Ti-rich TiN barrier layer 34 reacts with Si from $SiH_4$ to improve adsorption of Si to barrier layer 34.

After the Si adsorption, excess $SiH_4$ is removed from around the structure by purging or pumping out the chamber containing the structure. Then, a flow of an Al-containing gas, such as trimethyl aluminum (TMA), is supplied to barrier layer 34 to which Si atoms have been adsorbed. As a result, the methyl group of the TMA vaporizes through a reaction 1 between TMA and $SiH_4$ on the surface of barrier layer so that Al atoms are adsorbed to barrier layer 34.

Reaction 1: $Al(CH_3)_3 + SiH_4 \rightarrow Si-Al + CH_4(\uparrow)$

To promote the Al adsorption, $H_2$ gas is provided together with the TMA, so that a reaction 2 also occurs.

Reaction 2: $Al(CH_3)_3 + H_2 \rightarrow Al + CH_4(\uparrow)$

In the exemplary embodiment, the flow rate of the Al-containing gas is 10 sccm or less, preferably 2 to 3 sccm for between about 0.1 seconds and about 300 seconds, in a carrier gas of ($H_2$, Ar, or He) with a flow between 0 and 500 sccm, preferably about 80 to 120 sccm. The pressure in the chamber is between about 0.1 and 5 torr, preferably between 0.5 and 1.5 torr, and the temperature in the chamber remains between about 320 and 420° C. Dimethylamluminum hydride (DMAH), dimethylethylamine alane (DMEM) or triisobutylaluminum (TIBA) also can be used as the Al-containing gas. After the Al adsorption (or deposition) is completed, excess TMA is purged from the chamber containing the semiconductor structure.

The above-described Si and Al adsorption processes are repeated as many times as required to form interface control layer 42 having a desirable thickness, for example between 3 and 10 Å. The deposition rate of interface control layer 42 is controlled to produce a highly densified Al layer containing Si, which has a uniform grain size. Then, when CVD forms an Al interconnection layer on interface control layer 42, the Al interconnection layer grows uniformly from uniformly and densely distributed nucleation sites. The Si atoms in interface control layer 42 precipitate along Al grain boundaries and within grains, thereby promoting uniform distribution of Al nucleation sites and preventing Al agglomeration. Otherwise, Al easily agglomerates, and the Al layer grows rapidly at specific nucleation sites as a thickness of the Al interconnection layer increases. Thus, it is important to control a deposition rate of interface control layer 42 to ensure grain excellent crystallization characteristics and a high density of close nucleation sites.

ALD forms interface control layer 42 in the above embodiment. Alternatively, cyclic CVD or digital CVD can form the interface control layer 42. Interface control layer 42 is formed in units of atomic layers in which uniform grains are densely formed. Accordingly, making interface control layer 42, which has a number of dense and uniform atomic layers, requires a comparatively low deposition rate, so that uniform Al nuclei are randomly distributed on barrier layer 34. Typically, the deposition rate of a Al interconnection layer is higher than that of interface control layer 42, but the Al interconnection layer still forms with a uniform surface morphology.

Figure 1D:
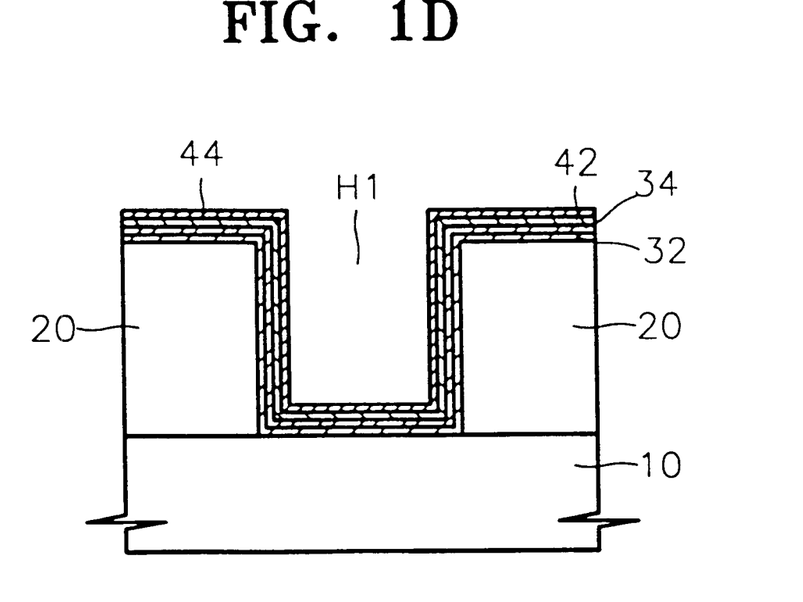

Referring to FIG. 1D, a hydrogen-containing gas such as hydrogen ($H_2$) or silane ($SiH_4$) or nitrogen-containing gas such as ammonia $NH_3$ is supplied to the surface of interface control layer 42, so that hydrogen or nitrogen is adsorbed to interface control layer 42 and forms a thin surface treatment layer 44 on interface control layer 42. In the exemplary embodiment, the reaction chamber containing the semiconductor structure including interface control layer 42 is filled with hydrogen or ammonia at a pressure between about 0.1 and 50 torr, preferably about 1 torr, at a temperature between about 200 and 500° C., preferably between about 380 and 420° C. The gas flow rate is between about 50 and 500 sccm, preferably about 100 sccm, for a period between about 30 seconds and 30 minutes, preferably about 1 minute. Surface treatment layer 44 helps prevent oxidation of interface control layer 42 if the semiconductor structure is exposed to air before formation of the interconnection layer, for example, when moving the semiconductor structure to another processing apparatus for formation of an interconnection layer. However, forming treatment layer 44 can be omitted when the interconnection layer can be in-situ after forming interface control layer 42.

Figure 1E:
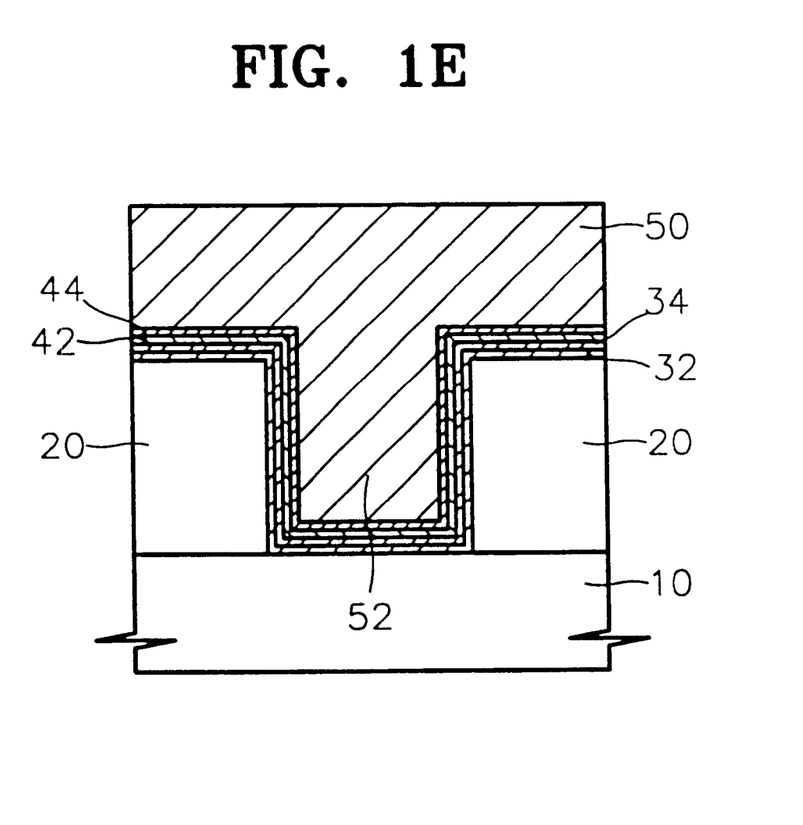

Referring to FIG. 1E, a CVD blanket deposition of Al forms a contact plug 52 in contact hole H1 and a 1,000 to 8,000 Å thick interconnection layer 50 connected is to contact plug 52 on surface treatment layer 44. In the exemplary embodiment, CVD forming plug 52 and layer 50 uses a flow between 1 and 50 sccm, preferably between 3 and 5 sccm, of TMA in a carrier gas flow between about 10 and 500 sccm, preferably between 90 and 110 sccm, through a chamber at a temperature between about 100 and 500° C., preferably between 110 and 130° C. and a pressure between about 0.1 and 100 torr, preferably between about 0.5 and 1.5 torr. Here, because interface control layer 42 is previously formed in contact hole H1, contact plug 52 can completely fill contact hole H1 and simultaneously interconnection layer 50 having the excellent surface morphology can be obtained.

FIGS. 2A to 2D illustrate a method for fabricating a semiconductor device according to another embodiment of the present invention.

Figure 2A:
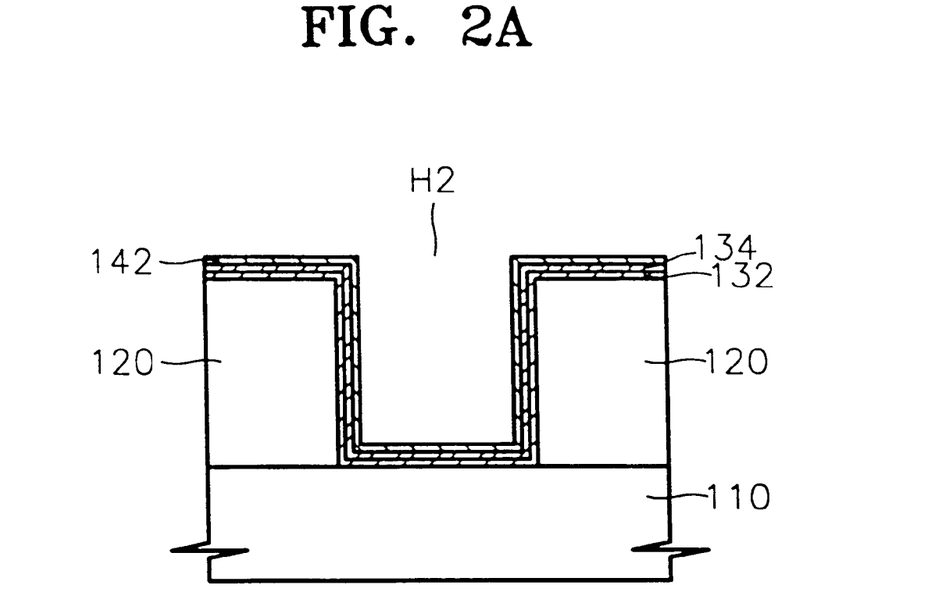
FIGS. 2A through 2D are sectional views of semiconductor structures illustrating a semiconductor device fabrication method according to another embodiment of the present invention.

Referring to FIG. 2A, in the same way as described with reference to FIGS. 1A and 1B, an ILD film 120 having a contact hole H2 is formed on a semiconductor substrate 110; an ohmic layer 132 is formed on inner walls of contact hole H2 and an upper surface of ILD film 120; and a TiN barrier layer 134 is formed on ohmic layer 132.

Then, ALD forms an interface control layer 142, which is made of copper (Cu), titanium (Ti), tungsten (W), silicon (Si), tantalum (Ta) or silver (Ag), on the inner wall of contact hole H2 and the surface of ILD film 120 which have been covered with ohmic layer 132 and barrier layer 134. Interface control layer 142 contains multiple atomic layers and has a thickness of several angstroms to several tens of angstroms, preferably, less than 20 Å.

In an exemplary embodiment described further below, interface control layer 142 is Cu. In an ALD for forming Cu interface control layer, (hexafluoroacetyl) copper (trimethylvinylsilane) [(hfac)Cu(TMVS)], $CuCl_2$, $Cu_2I_4$ or a combination thereof, as a source gas of Cu, is flushed on barrier layer 134, so that Cu atoms are adsorbed to barrier layer 134. The exemplary ALD process use a flow of (hfac)Cu(TMVS) at a flow rate between 1 sccm and 500 sccm, preferably 10 sccm, at a temperature between about 100 and 400° C., preferably about 220 to 270° C., and a pressure between about 0.1 and 100 torr, preferably between about 0.5 and 1.5 torr, for between 1 second and 10 minutes, preferably about 1 minute. Then, excess source gas is purged from around the semiconductor structure using hydrogen ($H_2$), helium (He) or argon (Ar) gas. The flushing and purging are repeated as many times as required to form interface control layer 142 formed of multiple thin Cu atomic layers deposited in sequence.

When interface control layer 142 is Ti, $TiCl_4$, tridiethylamine titanate (TDEAT), tridimethylamine titanate (TDMAT) gas or a combination thereof is used as a source gas. When interface control layer 142 is W, $WF_6$ gas is used; and for a Si interface control layer, $SiH_3Cl$, $SiH_2Cl_2$, $SiHCl_3$, $Si_2H_6$, $SiCl_4$ gas or a combination thereof is used. Process parameters for the ALD process vary according to the source gas.

Figure 2B:
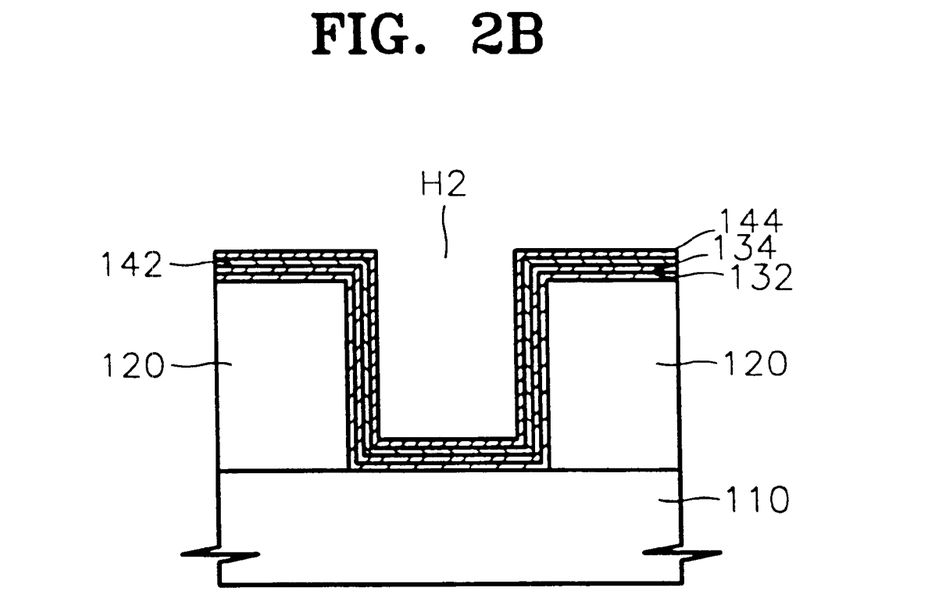

Referring to FIG. 2B, a flow of a hydrogen-containing or nitrogen-containing gas is supplied to the surface of interface control layer 142, so that hydrogen or nitrogen is adsorbed to interface control layer 142 and forms a thin surface treatment layer 144 on interface control layer 142. Surface treatment layer 144 helps prevent oxidation of interface control layer 142.

Figure 2C:
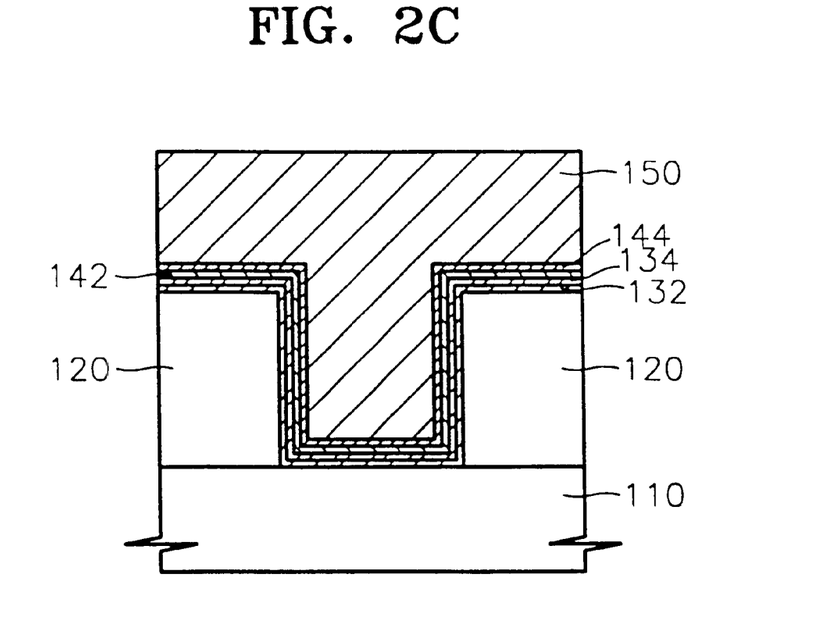

Referring to FIG. 2C, a CVD blanket deposition of Al fills contact hole H2 and forms conductive layer 150 on surface treatment layer 144. When the CVD blanket deposition is performed in-situ after forming interface control layer 142, forming surface treatment layer 144 may be omitted.

Referring to FIG. 2C, Al blanket deposition on the semiconductor structure fills the contact hole H2 and simultaneously forms a conductive layer 150 covering the upper surface of ILD film 120. In the exemplary embodiment, Cu interface control layer 142 promotes uniform Al grain nucleation and prevents Al agglomeration in the CVD blanket deposition. Accordingly, interconnection layer 150 has excellent surface morphology even if interconnection layer 150 is thick. Preferably, forming conductive layer 150 is in-situ after forming interface control layer 142.

Figure 2D:
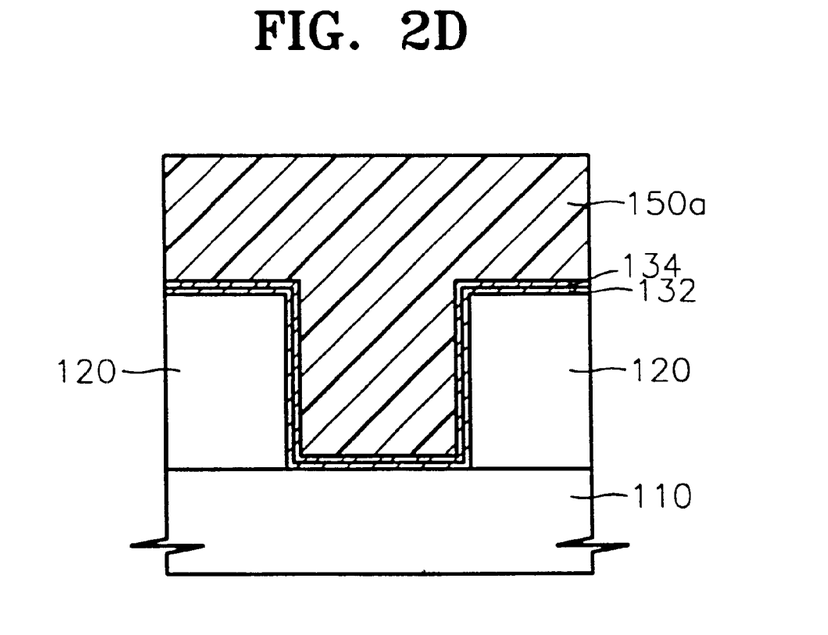

Referring to FIG. 2D, annealing form an Al interconnection layer 150a doped with Cu by promoting a diffusion of Cu atoms from interface control layer 142 into conductive layer 150. The annealing is performed at 300 to 650° C., preferably 450 to 500° C., for between 5 minutes and 60 minutes, preferably about 30 minutes. For example, when 0.5 atomic% Cu doping in Al interconnection layer 150a is required, Cu interface control layer 142 is to be about 20 Å thick. The doping of Al interconnection layer 150a improves reliability of Al interconnection layer 150a.

As described above, when CVD forms conductive layer 150 while Cu of interface control layer 142 is adsorbed to the TiN surface of barrier layer 134, an Al conductive layer having excellent surface morphology can be obtained even if the Al conductive layer is thick. Also, Cu in the Al interconnection layer 150a acts as a dopant, thereby improving reliability of the interconnection layer. An interface control layer formed of Ti, W, Si, Ta or Ag can produce the same effect as a Cu interface control layer. However, required annealing temperature vary depending on the composition of interface control layer. For example, a Ti interface control layer's annealing temperature is about 400 to 650° C.

Figure 3A:
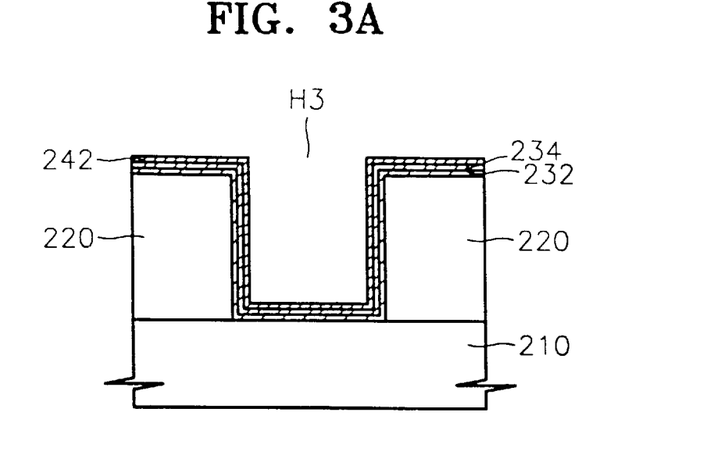
FIGS. 3A through 3E are sectional views of semiconductor structures illustrating a semiconductor device fabrication method according to still another embodiment of the present invention.

FIGS. 3A through 3E illustrate a fabrication method to still another embodiment of the present invention. Referring to FIG. 3A, an ILD film 220 is formed on a semiconductor substrate 210 with a contact hole H3 through ILD 220 exposing a conductive region of semiconductor substrate 210. An ohmic layer 232 is formed of Ti on the exposed conductive region of semiconductor substrate 210, the side walls of contact hole H3 in ILD film 220, and the upper surface of ILD film 220, and then a barrier layer 234 is formed of TiN on ohmic layer 232. These layers can be formed in sequence by the same processes described above in reference to corresponding layers illustrated in FIGS. 1A and 1B.

Then, a first interface control layer 242, as a thin Al film containing Si, is formed on barrier layer 234, to a thickness on the order of several angstroms to several tens of angstroms, preferably, less than 10 Å. Again, the same method described with reference to FIG. 1C for forming interface control layer 42 can form first interface control layer 242.

Figure 3B:
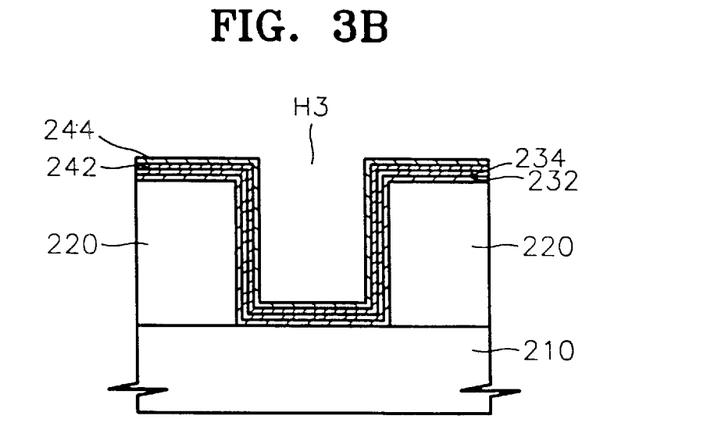

Referring to FIG. 3B, a second interface control layer 244, which is formed of Cu, is formed on first interface control layer 242 by the same method as described with reference to FIG. 2A. Alternatively, second interface control layer 244 may also be formed of Ti, W, Si, Ta or Ag, instead of Cu. In this embodiment, second interface control layer 244 is continuous thin layers as described above. However, second interface control layer 244 may include multiple separated islands on first interface control layer 242. Such islands can be formed by using a mask to limit formation of second interface control layer 244 to specific areas. Alternatively, selective etching can pattern a continuous layer.

Figure 3C:
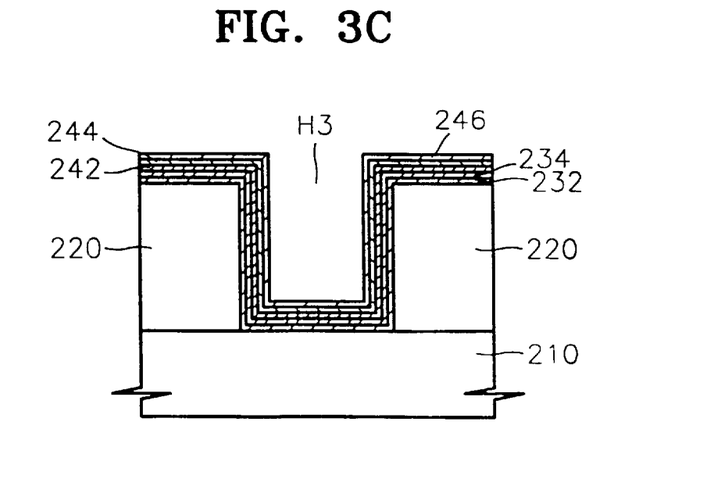

Referring to FIG. 3C, a hydrogen-containing gas or nitrogen-containing gas is supplied to the surface of interface control layer 244 to form a thin surface treatment layer 246 on interface control layer 244 in the same way that was described with reference to FIGS. 1D and 2B. Surface treatment layer 246 helps prevent oxidation of interface control layer 244, for example, when moving the semiconductor structure to another processing apparatus.

Figure 3D:
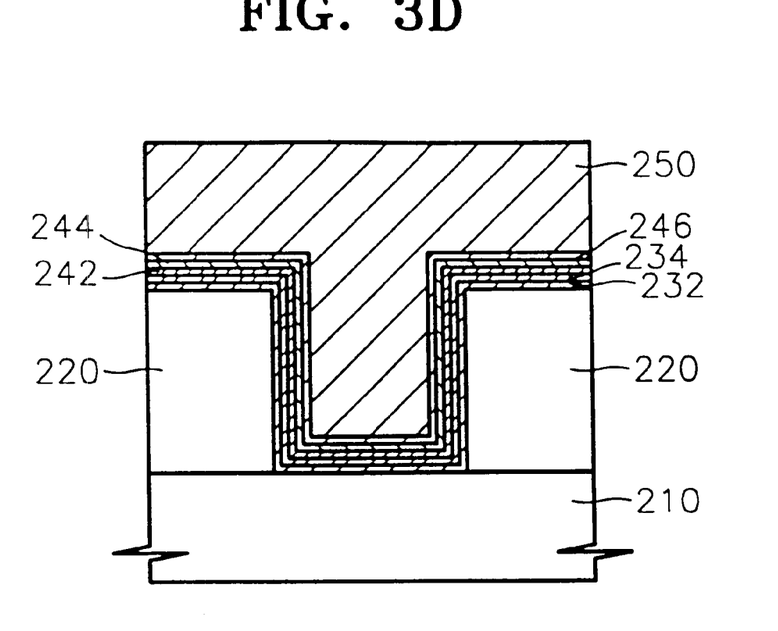

Referring to FIG. 3D, a CVD blanket deposition of Al fills contact hole H3 and forms conductive layer 250 on surface treatment layer 246. When the CVD blanket deposition is performed in-situ after forming interface control layer 244, forming surface treatment layer 246 may be omitted. Like the previously described methods, interface control layers 242 and 244 promote uniform Al grain nucleation and prevents Al agglomeration in the CVD blanket deposition, so that conductive layer 250 can have a uniform surface morphology.

Figure 3E:
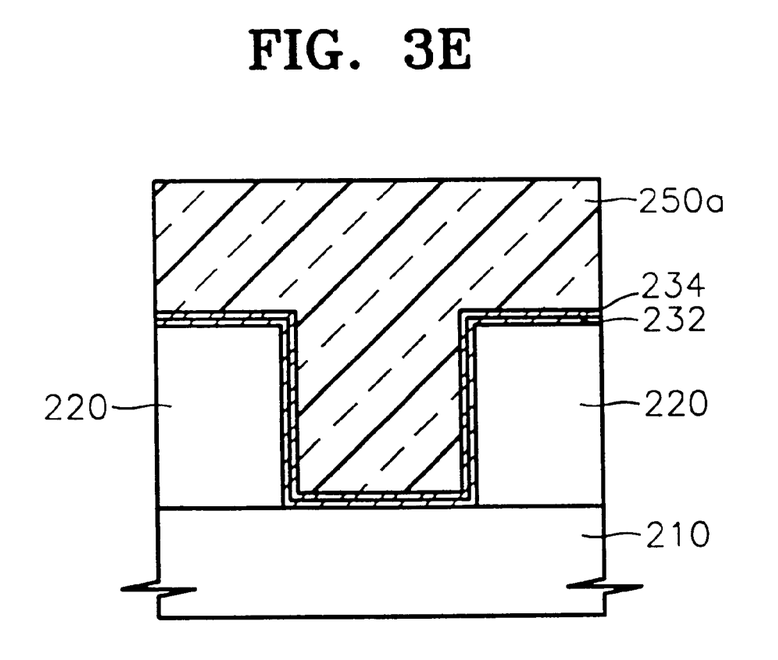

Referring to FIG. 3E, an annealing of conductive layer 250 forms an Al interconnection layer 250a doped with Cu by promoting a diffusion of Cu atoms from second interface control layer 244 into conductive layer 250. The annealing is performed at about 300 to 500° C., preferably, about 450 to 480° C. The doping of Al interconnection layer 250a improves reliability of Al interconnection layer 250a.

As described above, an interface control layer formed according to the present invention promotes a uniform deposition of an interconnection layer which is formed on the interface control layer, so that the interconnection layer can have a uniform surface morphology. In addition, the interface control layer can act as a dopant of the interconnection layer, thereby improving reliability of the interconnection layer.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A semiconductor device fabrication method comprising:
    (a) forming an interlayer dielectric (ILD) film having a contact hole, the contact hole exposing a conductive region of an underlying structure;
    (b) forming an interface control layer of a plurality of atomic layers continuously deposited on inner walls of the contact hole and an upper surface of the interlayer dielectric film; and
    (c) forming a contact plug in the contact hole and an interconnection layer on the inferface control layer by depositing aluminum in the contact hole and on the interface control layer.

2. The method of claim 1, wherein after step (a) and before step (b), the method further comprises:
    forming an ohmic layer on the inner walls of the contact hole and on the upper surface of the interlayer dielectric film; and
    forming a barrier layer on the ohmic layer,
    wherein the interface control layer is formed on the barrier layer.

3. The method of claim 2, wherein the interface control layer is an aluminum (Al) layer containing silicon (Si).

4. The method of claim 3, wherein atomic layer deposition (ALD) forms the interface control layer.

5. The method of claim 4, wherein step (b) comprises:
    (b1) flowing a Si-containing gas on the barrier layer, so that Si atoms are adsorbed to the barrier layer;
    (b2) removing excess Si-containing gas from around the barrier layer;
    (b3) flowing an Al-containing gas on the barrier layer to which the Si atoms were adsorbed, so that Al atoms are adsorbed to the barrier layer;
    (b4) removing excess Al-containing gas from around the barrier layer; and
    (b5) repeating steps (b1) through (b4) to form the Al layer containing Si on the barrier layer.

6. The method of claim 5, wherein the barrier layer is a titanium (Ti)-rich titanium nitride (TiN) layer.

7. The method of claim 5, wherein hydrogen ($H_2$) gas is supplied together with the Al-containing gas in step (b3) to facilitate deposition of Al atoms.

8. The method of claim 1, further comprising annealing the semiconductor device after step (c), so that the interconnection layer is doped with metal atoms from the interface control layer.

9. The method of claim 8, wherein after step (a) and before step (b), the method further comprises:

forming an ohmic layer on the inner walls of the contact hole and on the upper surface of the interlayer dielectric film; and forming a barrier layer on the ohmic layer, wherein the interface control layer is formed on the barrier layer in step (b).

10. The method of claim 9, wherein the interface control layer is formed of a material selected from a group consisting of copper (Cu), titanium (Ti), tungsten (W), silicon (Si), tantalum (Ta), and silver (Ag).

11. The method of claim 10, wherein a method selected from a group consisting of atomic layer deposition (ALD), cyclic CVD, and digital CVD forms the interface control layer.

12. The method of claim 11, wherein the interface control layer is formed of Ti, and step (b) comprises flowing a gas selected from a group consisting of $TiCl_4$, tridiethylamine titanate, tridimethylamine titanate, and combinations thereof.

13. The method of claim 11, wherein the interface control layer is formed of W, and step (b) comprises flowing $WF_6$ gas.

14. The method of claim 11, wherein the interface control layer is formed of Si, and step (b) comprises flowing a gas selected from a group consisting of $SiH_3Cl$, $SiH_2Cl_2$, $SiHCl_3$, $Si_2H_6$ or $SiCl_4$ and combinations thereof.

15. The method of claim 10, wherein the interface control layer is formed of Cu, and step (b) comprises:

(b1) flowing a source gas selected from a group consisting of (hexafluoroacetyl)copper(trimethylvinylsilane), $CuCl_2$, $Cu_2I_4$, and combinations thereof so that Cu atoms are adsorbed to the barrier layer;

(b2) purging the source gas from around the semiconductor device after step (b1); and (b3) repeating steps (b1) and (b2).

16. The method claim 1, further comprising annealing the semiconductor device after step (c) so that the interconnection layer is doped with metal atoms from the interface control layer, and step (b) comprises:

(b') forming a first interface control layer as an Al film containing Si and a plurality of atomic layers on the inner wall of the contact hole and the upper surface of the interlayer dielectric film; and (b") forming a second interface control layer having a plurality of atomic layers continuously deposited on the first interface control layer.

17. The method of claim 16, wherein after step (a) and before step (b), the method further comprises:

forming an ohmic layer on the inner walls of the contact hole and on the upper surface of the interlayer dielectric film; and forming a barrier layer on the ohmic layer, wherein the first interface control layer is formed on the barrier layer.

18. The method of claim 17, wherein atomic layer deposition (ALD) forms the first and second interface control layers.

19. The method of claim 18, wherein step (b') comprises:

(b'1) applying a Si-containing gas to the barrier layer so that Si atoms are adsorbed to the barrier layer;

(b'2) removing excess Si-containing gas from around the semiconductor device;

(b'3) applying an Al-containing gas to the barrier layer to which the Si atoms are adsorbed, so that Al atoms are adsorbed to the barrier layer;

(b'4) removing excess Al-containing gas from around the semiconductor device; and (b'5) repeating steps (b'1) through (b'4) to form the Al film containing Si on the barrier layer.

20. The method of claim 19, wherein hydrogen ($H_2$) gas is applied together with the Al-containing gas in step (b'3).

21. The method of claim 18, wherein the second interface control layer is formed of a material selected from a group consisting of copper (Cu), titanium (Ti), tungsten (W), silicon (Si), tantalum (Ta) and silver (Ag).

22. The method of claim 21, wherein the second interface control layer is formed of Cu, and step (b") comprises:

(b"1) applying a gas selected from a group consisting of (hexafluoroacetyl)copper(trimethylvinylsilane) ) [(hfac)Cu(TMVS)], $CuCl_2$, $Cu_2I_4$, and combinations thereof so that Cu atoms are adsorbed to the barrier layer;

(b"2) purging from around the semiconductor device after step (b"1); and (b"3) repeating steps (b"1) and (b"2).

23. The method of claim 1, wherein step (c) is performed in-situ after step (b).

24. The method of claim 1, wherein after step (b) and before step (c), the method further comprises forming a surface treatment layer on the interface control layer, the surface treatment layer preventing oxidation of the surface of the interface control layer, wherein Al deposition in step (c) is performed on the surface treatment layer.

25. The method of claim 24, wherein the surface treatment layer is formed by adsorbing hydrogen or nitrogen to the interface control layer.

* * * * *